US011437218B2

(12) United States Patent
Lanza et al.

(10) Patent No.: US 11,437,218 B2
(45) Date of Patent: Sep. 6, 2022

(54) APPARATUS AND METHOD FOR NANOSCALE X-RAY IMAGING

(71) Applicant: Massachusetts Institute of Technology, Cambridge, MA (US)

(72) Inventors: Richard C. Lanza, Brookline, MA (US); Berthold Klaus Paul Horn, Chatham, NH (US); Akintunde I. Akinwande, Newton, MA (US); George Barbastathis, Boston, MA (US); Rajiv Gupta, Boston, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 17/020,734

(22) Filed: Sep. 14, 2020

(65) Prior Publication Data
US 2021/0151288 A1    May 20, 2021

Related U.S. Application Data

(60) Provisional application No. 62/935,541, filed on Nov. 14, 2019.

(51) Int. Cl.
*H01J 37/28* (2006.01)
*H01J 37/24* (2006.01)
(Continued)

(52) U.S. Cl.
CPC ............ *H01J 37/28* (2013.01); *G01N 23/044* (2018.02); *G01N 23/2252* (2013.01);
(Continued)

(58) Field of Classification Search
CPC ........ H01J 37/28; H01J 37/244; H01J 37/256; H01J 2237/2004; H01J 2237/20207; H01J 2237/2807; G01N 23/044; G01N 23/2252
(Continued)

(56) References Cited

U.S. PATENT DOCUMENTS 5,729,583 A * 3/1998 Tang ..................... H01J 35/32
378/138
7,082,182 B2 7/2006 Zhou et al.
(Continued)

FOREIGN PATENT DOCUMENTS

WO    WO 2011/044199 A1    4/2011

OTHER PUBLICATIONS

U.S. Appl. No. 16/325,936, filed Feb. 15, 2019, Akinwande et al.
(Continued)

*Primary Examiner* — Nicole M Ippolito
(74) *Attorney, Agent, or Firm* — Wolf, Greenfield & Sacks, P.C.

(57) ABSTRACT

System and method for nanoscale X-ray imaging. The imaging system comprises an electron source configured to generate an electron beam along a first direction; an X-ray source comprising a thin film anode configured to receive the electron beam at an electron beam spot on the thin film anode, and to emit an X-ray beam substantially along the first direction from a portion of the thin film anode proximate the electron beam spot, such that the X-ray beam passes through the sample specimen. The imaging apparatus further comprises an X-ray detector configured to receive the X-ray beam that passes through the sample specimen. Some embodiments are directed to an electron source that is an electron column of a scanning electron microscope (SEM) and is configured to focus the electron beam at the electron beam spot.

19 Claims, 6 Drawing Sheets

(51) Int. Cl.
*H01J 37/256* (2006.01)
*G01N 23/22* (2018.01)
*G01N 23/04* (2018.01)
*H01J 37/244* (2006.01)
*G01N 23/2252* (2018.01)
*G01N 23/044* (2018.01)

(52) U.S. Cl.
CPC .......... *H01J 37/244* (2013.01); *H01J 37/256* (2013.01); *H01J 2237/2004* (2013.01); *H01J 2237/20207* (2013.01); *H01J 2237/2807* (2013.01)

(58) Field of Classification Search
USPC ................ 250/305, 306, 307, 309, 310, 311
See application file for complete search history.

(56) References Cited

U.S. PATENT DOCUMENTS

| | | | |
|---|---|---|---|
| 7,920,673 B2 | 4/2011 | Lanza et al. | |
| 7,940,888 B2 | 5/2011 | Tsujii | |
| 8,290,118 B2 | 10/2012 | Tsujii | |
| 9,129,715 B2 | 9/2015 | Adler et al. | |
| 9,279,775 B2 | 3/2016 | Tsujii | |
| 9,607,724 B2 | 3/2017 | Adler | |
| 9,646,732 B2 | 5/2017 | Adler et al. | |
| 10,045,752 B2 | 8/2018 | Gupta et al. | |
| 10,068,740 B2 | 9/2018 | Gupta et al. | |
| 10,229,951 B2 | 3/2019 | Jiang et al. | |
| 10,591,424 B2 | 3/2020 | Morton | |
| 10,748,956 B2 | 8/2020 | Jiang et al. | |
| 2003/0198318 A1 | 10/2003 | Price et al. | |
| 2004/0213378 A1 | 10/2004 | Zhou et al. | |
| 2005/0074088 A1 | 4/2005 | Ichihara et al. | |
| 2006/0008047 A1 | 1/2006 | Zhou et al. | |
| 2006/0054879 A1 | 3/2006 | Jin | |
| 2006/0202125 A1 | 9/2006 | Suhami | |
| 2007/0009081 A1 | 1/2007 | Zhou et al. | |
| 2007/0053489 A1 | 3/2007 | Lu et al. | |
| 2007/0085459 A1 | 4/2007 | Hudspeth et al. | |
| 2007/0195927 A1 | 8/2007 | Fung et al. | |
| 2007/0206726 A1 | 9/2007 | Lu et al. | |
| 2007/0247048 A1 | 10/2007 | Zhang et al. | |
| 2008/0075229 A1* | 3/2008 | Ryan ............... | H01J 35/112 378/70 |
| 2010/0189223 A1 | 7/2010 | Eaton et al. | |
| 2010/0290593 A1 | 11/2010 | Legagneux et al. | |
| 2010/0329416 A1 | 12/2010 | Tsujii | |
| 2011/0188628 A1 | 8/2011 | Tsujii | |
| 2011/0249802 A1 | 10/2011 | Okunuki et al. | |
| 2011/0299653 A1 | 12/2011 | Mishra et al. | |
| 2012/0008739 A1 | 1/2012 | Hoernig et al. | |
| 2012/0025110 A1 | 2/2012 | Davis et al. | |
| 2012/0057669 A1 | 3/2012 | Vogtmeier et al. | |
| 2012/0106702 A1 | 5/2012 | Feke | |
| 2012/0140895 A1 | 6/2012 | Okunuki et al. | |
| 2012/0170718 A1 | 7/2012 | Travish et al. | |
| 2012/0307974 A1 | 12/2012 | Yamazaki et al. | |
| 2012/0318987 A1 | 12/2012 | Miyazaki et al. | |
| 2013/0003920 A1 | 1/2013 | Tsujii | |
| 2013/0058452 A1 | 3/2013 | Levene et al. | |
| 2013/0063731 A1 | 3/2013 | Gaspardo et al. | |
| 2013/0202082 A1 | 8/2013 | Okunuki et al. | |
| 2013/0272503 A1 | 10/2013 | Eaton | |
| 2014/0064445 A1 | 3/2014 | Adler | |
| 2014/0140484 A1 | 5/2014 | Shiraki et al. | |
| 2014/0205058 A1 | 7/2014 | Tagawa | |
| 2014/0211919 A1 | 7/2014 | Ogura et al. | |
| 2014/0241492 A1 | 8/2014 | Tamura et al. | |
| 2014/0301528 A1 | 10/2014 | La Riviere | |
| 2014/0369471 A1 | 12/2014 | Ogura et al. | |
| 2015/0016593 A1 | 1/2015 | Larson et al. | |
| 2015/0124934 A1 | 5/2015 | Gupta et al. | |
| 2015/0146848 A1 | 5/2015 | Gupta et al. | |
| 2015/0155134 A1 | 6/2015 | Frosien et al. | |
| 2015/0270023 A1 | 9/2015 | Adler | |
| 2016/0351283 A1 | 12/2016 | Adler et al. | |
| 2016/0372298 A1 | 12/2016 | Evans et al. | |
| 2017/0004949 A1 | 1/2017 | Kenmotsu et al. | |
| 2017/0025317 A1 | 1/2017 | Tingay et al. | |
| 2017/0031053 A1 | 2/2017 | Kumar et al. | |
| 2017/0050046 A1 | 2/2017 | Walder et al. | |
| 2017/0162359 A1 | 6/2017 | Tang et al. | |
| 2017/0200524 A1 | 7/2017 | Adler | |
| 2017/0231582 A1 | 8/2017 | Ro | |
| 2019/0206652 A1 | 7/2019 | Akinwande et al. | |
| 2020/0085392 A1 | 3/2020 | Lanza et al. | |

OTHER PUBLICATIONS

U.S. Appl. No. 16/684,372, filed Nov. 14, 2019, Lanza et al.
PCT/US2017/047030, Oct. 30, 2017, Invitation to Pay Additional Fees.
PCT/US2017/047030, Jan. 9, 2018, International Search Report and Written Opinion.
PCT/US2017/047030, Feb. 28, 2019, International Preliminary Report on Patentability.
International Preliminary Report on Patentability dated Feb. 28, 2019 in connection with International Application No. PCT/US2017/047030.
Invitation to Pay Additional Fees mailed Oct. 30, 2017 in connection with International Application No. PCT/US2017/047030.
International Search Report and Written Opinion dated Jan. 9, 2018 in connection with International Application No. PCT/US2017/047030.
[No Author Listed], ntCT Forward-Thinking Nano CT. Fraunhofer EZRT. To the best of our knowledge the date of this reference is Apr. 17, 2019. 2 pages.
Ando et al., Crystal analyser-based X-ray phase contrast imaging in the dark field: implementation and evaluation using excised tissue specimens. European radiology. Feb. 1, 2014;24(2):423-33.
Ando et al., Dark-Field Imaging: Recent developments and potential clinical applications. Physica Medica. Dec. 1, 2016;32(12):1801-12.
Ando et al., Tissue visualization using X-ray dark-field imaging towards pathological goal. IOP Publishing, Journal of Physics: Conference Series. 2013;425(19):192006-9.
Boland et al., The potential of cryo-electron microscopy for structure-based drug design. Essays in biochemistry. Nov. 8, 2017;61(5):543-60.
Bunch et al., Impermeable atomic membranes from graphene sheets. Nano letters. Aug. 13, 2008;8(8):2458-62.
Correia et al., Advanced vibration suppression algorithms in adaptive optics systems. Journal of the Optical Society of America A. Mar. 1, 2012;29(3):185-94.
Davis, Using a light microscope to measure motions with nanometer accuracy. Optical Engineering. Apr. 1998;37:1299-304.
Devaney, Inverse-scattering theory within the rytov approximation. Optics Letters. Aug. 1, 1981;6(8):374-6.
Gaglia et al., Noninvasive mapping of pancreatic inflammation in recent-onset type-1 diabetes patients. Proceedings of the National Academy of Sciences. Feb. 17, 2015;112(7):2139-44.
Guerrera et al., Nanofabrication of arrays of silicon field emitters with vertical silicon nanowire current limiters and self-aligned gates. Nanotechnology. Jun. 13, 2016;27(29):295302-12.
Harisinghani et al., Noninvasive detection of clinically occult lymph-node metastases in prostate cancer. New England Journal of Medicine. 2003;348(25):2491-2499.
Heintzmann et al., Super-resolution structured illumination microscopy. Chemical Reviews. 2017;117:13890-13908.
Ielmini, Resistive switching memories based on metal oxides: mechanisms, reliability and scaling. Semiconductor Science and Technology. 2016; 31(6):063002.
Kalender, X-ray computed tomography. Physics in Medicine & Biology. Jun. 20, 2006;51(13):R29-43.

(56) References Cited

OTHER PUBLICATIONS

Kampschulte et al., A. Nano-computed tomography: Technique and applications. RöFo-Fortschritte auf dem Gebiet der Röntgenstrahlen und der bildgebenden Verfahren. Feb. 2016;188(02):146-154.
Kirsch, Basic principles of magnetic resonance contrast agents. Top Magn Reson Imaging. 1991;3(2):1-18.
Kirschbaum et al., In vivo nanoparticle imaging of innate immune cells can serve as a marker of disease severity in a model of multiple sclerosis. Proceedings of the National Academy of Sciences. Nov. 15, 2016;113(46):13227-32.
Kornguth et al., Magnetic resonance imaging of gadolinium-labeled monoclonal antibody polymers directed at human T lymphocytes implanted in canine brain. Journal of neurosurgery. Jun. 1, 1987;66(6):898-906.
Langer et al., Scientific discovery and the future of medicine. JAMA. 2015;313:135-6.
Lee et al., Excellent uniformity and reproducible resistance switching characteristics of doped binary metal oxides for non-volatile resistance memory applications. IEEE. 2006 International Electron Devices Meeting. Dec. 2006;1-4.
Li et al., Efficient and self-adaptive in-situ learning in multilayer memristor neural networks. Nature Communications. 2018; 9(1):2385.
Li et al., Three-dimensional crossbar arrays of self-rectifying Si/SiO 2/Si memristors. Nature Communications. 2017;8:15666.
Li, Ultrathin graphene oxide membranes/coatings for separations. Chemical Engineering, University of South Carolina Master's Thesis. 2014:113 pages.
Lutter et al., XRM-II nanoCT-SEM based computed tomography. International Symposium on Digital Industrial Radiology and Computed Tomography—DIR2019. To the best of our knowledge the date of this reference is Jul. 2, 2019. 7 pages.
McCord et al., Rebl: Design progress toward 16 nm half-pitch maskless projection electron beam lithography. SPIE Proceedings. Mar. 21, 2012;8323:832311-832321.
Miller et al., Imaging the pharmacology of nanomaterials by intravital microscopy: Toward understanding their biological behavior. Adv Drug Deliv Rev. 2017;113:61-86.
Miller et al., Predicting therapeutic nanomedicine efficacy using a companion magnetic resonance imaging nanoparticle. Science translational medicine. Nov. 18, 2015;7(314):314ra183.
Miller et al., Tumour-associated macrophages act as a slow-release reservoir of nano-therapeutic Pt (IV) pro-drug. Nature communications. Oct. 27, 2015;6(1):1-13.
Neice, Methods and limitations of subwavelength imaging. Advances in Imaging and Electron Physics. 2010;163:117-140.
Pan et al., Contrast enhancement in x-ray phase contrast tomography. Optics Express. Jul. 28, 2014;22(15):18020-6.
Pathania et al., Holographic assessment of lymphoma tissue (HALT) for global oncology field applications. Theranostics. 2016;6(10):1603-1610.
Pattni et al., New developments in liposomal drug delivery. Chemical reviews. Oct. 14, 2015;115(19):10938-66.
Prost, Logic Circuits with reduced complexity based on devices with higher functionality. IST, EU IST Rep. LOCOM. 2000;28:844.
Pulli et al., Multiple sclerosis: myeloperoxidase immunoradiology improves detection of acute and chronic disease in experimental model. Radiology. May 2015;275(2):480-9.
Sheridan, Proof of concept for next-generation nanoparticle drugs in humans. Nat Biotechnol. 2012;30(6):471-473.
Sinha et al., Lensless computational imaging through deep learning. Optica. Sep. 20, 2017;4(9):1117-25.
Skinner-Ramos et al., Toward phase-recovery optical nanoscopes. Journal of Physical Science and Application. 2017;7(5):19-27.
Sunaguchi et al., An efficient reconstruction algorithm for differential phase-contrast tomographic images from a limited number of views. Applied Physics Letters. Dec. 21, 2015;107(25):253701.
Sunaguchi et al., In vitro validation of an artefact suppression algorithm in X-ray phase-contrast computed tomography. PloS one. Aug. 21, 2015;10(8):e0135654.
Sunaguchi et al., Limited view reconstruction for differential phase-contrast computed tomography. Optics express. Apr. 20, 2015;23(8):9717-29.
Sung et al., Compressed x-ray phase-contrast imaging using a coded source. Optics Communications. Dec. 1, 2014;332:370-378.
Sung et al., Full-wave approach for x-ray phase imaging. Optics express. Jul. 29, 2013;21(15):17547-57.
Sung et al., Phase-contrast imaging with a compact x-ray light source: system design. Journal of Medical Imaging. Nov. 2017;4(4):043503.
Sung et al., Realistic wave-optics simulation of x-ray phase-contrast imaging at a human scale. Scientific Reports. Jul. 14, 2015;5:12011.
Sung et al., X-ray phase tomography of a moving object. Optics express. Oct. 7, 2013;21(20):23671-9.
Turetsky et al., On chip analysis of cns lymphoma in cerebrospinal fluid. Theranostics. 2015:5:796-804.
Unger et al., Magnetic resonance imaging using gadolinium labeled monoclonal antibody. Investigative Radiology. Oct. 1, 1985;20(7):693-700.
Wang et al., Improving the electrical performance of resistive switching memory using doping technology. Chinese Science Bulletin. 2012;57(11):1235-1240.
Wicki et al., Nanomedicine in cancer therapy: challenges, opportunities, and clinical applications. Journal of controlled release. Feb. 28, 2015;200:138-57.
Wu et al., Electromagnetically induced transparency in V-, Λ-, and cascade-type schemes beyond steady-state analysis. Physical Review A. May 12, 2005;71(5):053806.

\* cited by examiner

APPARATUS AND METHOD FOR NANOSCALE X-RAY IMAGING

This application claims priority under 35 U.S.C. § 119(e) to U.S. Provisional Application Serial No. 62/935,541, filed Nov. 14, 2019 and entitled "APPARATUS AND METHOD FOR NANOSCALE X-RAY IMAGING," which is incorporated herein by reference in its entirety for all purposes.

STATEMENT OF GOVERNMENT SUPPORT

This invention was made with Government support under Grant No. FA8650-17-C-9113 awarded by the Air Force Research Laboratory (AFRL). The Government has certain rights in the invention.

BACKGROUND

Microscopes are analytical tools that enable visualization of a sample at micrometer to nanometer scale.

One type of microscopes are optical microscopes or light microscopes that operate based on illumination with light of optical wavelength. Spatial resolutions of conventional light microscopes are about 200-500 nm and are limited by the Rayleigh resolution limit, $\lambda/2NA$, where $\lambda$ is the wavelength of light and NA is the numerical aperture of the objective lens. Optical methods are limited in depth of penetration.

Scanning electron microscopes (SEM) operate based on illumination with accelerated electron beams, and are capable of 5- 35 nm spatial resolution. Electron microscopy suffers from limited depth of penetration and is unable to provide a tomographic view of a sample. Electron microscopy also require sample preparation and cannot visualize liquid or solid biopsy specimens in their native state.

SUMMARY

Some embodiments are directed to an imaging apparatus for imaging a sample specimen. The imaging apparatus comprises an electron source configured to generate an electron beam along a first direction; an X-ray source comprising a thin film anode configured to receive the electron beam at an electron beam spot on the thin film anode, and to emit an X-ray beam substantially along the first direction from a portion of the thin film anode proximate the electron beam spot, such that the X-ray beam passes through the sample specimen. The imaging apparatus further comprises an X-ray detector configured to receive the X-ray beam that passes through the sample specimen.

Other embodiments are directed to an imaging system for imaging a biological specimen. The imaging system comprises a scanning electron column configured to generate an electron beam along a first direction; an X-ray source comprising a thin film anode configured to receive the electron beam at an electron beam spot on the thin film anode, and to emit an X-ray beam substantially along the first direction from a portion of the thin film anode proximate the electron beam spot, such that the X-ray beam passes through the biological specimen; a vacuum enclosure arranged to substantially maintain a vacuum between the scanning electron column and the X-ray source; an X-ray detector configured to receive the X-ray beam that passes through the sample specimen; and a sample holder between the thin film anode and the X-ray detector and configured to separate the biological specimen from the vacuum maintained in the vacuum enclosure.

Some embodiments are directed to a method of imaging a biological specimen using an imaging apparatus. The imaging apparatus comprises an electron source, an X-ray detector, and a thin film anode between the electron source and the X-ray detector. The method comprises receiving an electron beam along a first direction at an electron beam spot on the thin film anode; emitting an X-ray beam along the first direction from a portion of the thin film anode proximate the electron beam spot, such that the X-ray beam passes through the biological specimen; acquiring, using at least one controller, a set of intensity data from the X-ray detector; and generating an X-ray image representative of the biological specimen based on the acquired set of intensity data.

Some embodiments are directed to an X-ray beam that has a spot size of between 1 and 20 nm, and preferably between 1 and 10 nm at an exit surface of the thin film anode.

Some embodiments are directed to a thin film anode that comprises a stack of a first metal film on a second metal film. In some embodiments, the first metal film comprises Cu, Mo, or Au, and the second metal film comprises Be.

Some embodiments are directed to an electron source that is an electron column of a scanning electron microscope (SEM) and is configured to focus the electron beam at the electron beam spot. In some embodiments, the electron column is configured to have an acceleration voltage of at least 20 KeV, such that a size of the electron beam spot on the thin film anode is between 1 and 5 nm, and preferably between 1 and 2 nm.

In some embodiments, the X-ray source comprises a substrate having a first side where the thin anode film is disposed thereon, and a second side in contact with the sample holder that is configured to hold the biological specimen.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
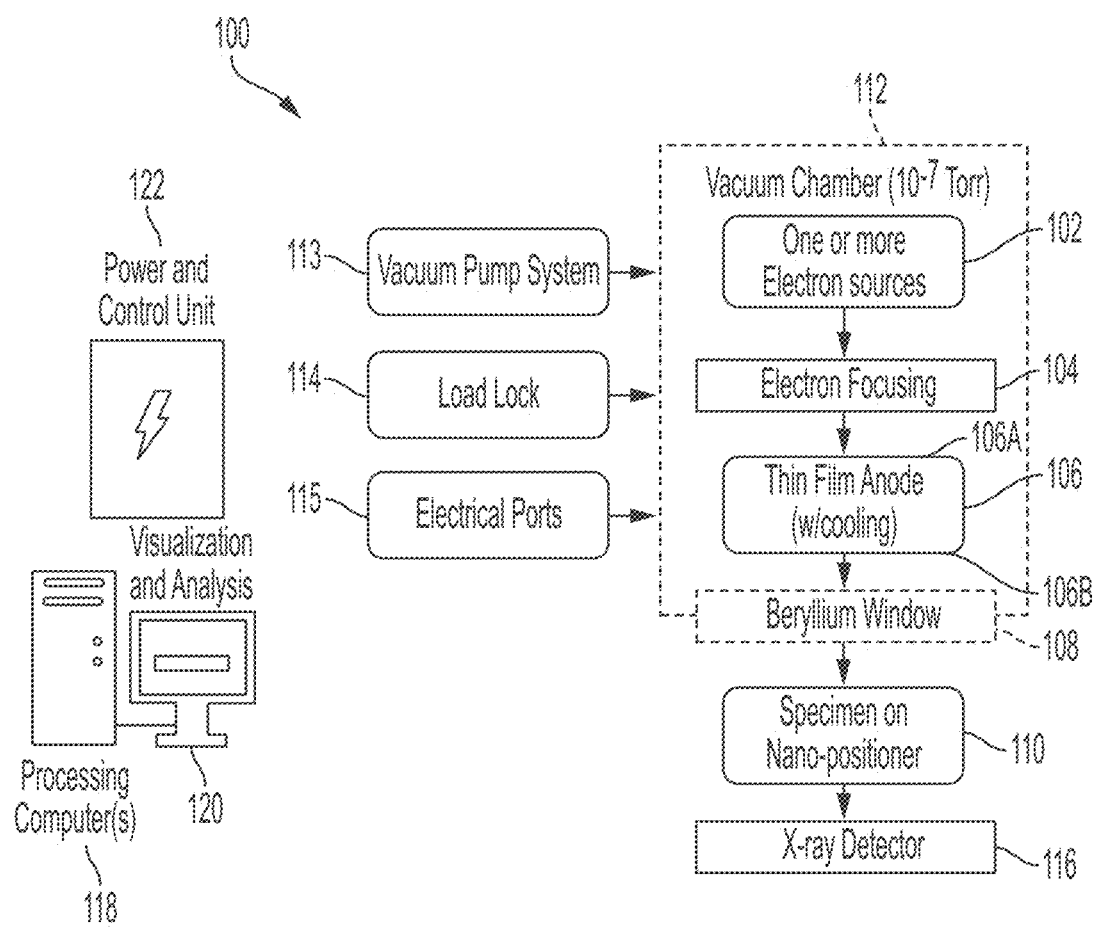
FIG. 1 is a high-level block diagram of an imaging system, in accordance with some embodiments.

The inventors have recognized and appreciated that X-ray microscopes, especially those in the soft X-ray regime of 10 to 0.05 angstroms, have a much lower Rayleigh resolution limit compared to optical microscopes and provide a mesoscale resolution that is in between light microscopy and electron microscopy. X-rays have an excellent penetration for soft-tissue specimens enabling imaging of specimens in their native state. Moreover, elaborate sample preparation or chemical fixation is not required, and it is also possible to tune X-ray imaging to the water window for improved contrast.

Aspects of the present application are directed to a compact imaging apparatus that can be sited in research labs or clinical environments to allow fast X-ray imaging of sample specimen such as integrated circuits for semiconductor inspection, or biological specimens for drug interaction or clinical studies. In some embodiments, the X-ray imaging apparatus disclosed herein may provide imaging of thick biological specimens in their natural (hydrated) state without elaborate chemical fixation or sample preparation.

Some aspects are directed to an X-ray imaging apparatus that has a high spatial resolution of about 30 nm or less, and in some embodiments of about 10 nm or less, which is sometimes referred to as an X-ray Nanoscope (XN). In some embodiments, a thin film anode is provided within an XN as a transmission anode for generating an X-ray beam with a tight spot size to improve imaging spatial resolution. An electron source generates an electron beam that impinges on an incident surface of the thin film anode, which emits an X-ray beam, a portion of which exits the surface of the thin film anode opposite the incident surface. The thin film anode comprises a heavy metal such as but not limited to Cu, Mo, Au, or combinations thereof. The inventors have recognized and appreciated that the size of the exiting X-ray beam depends on the size of the incident electron beam, and additionally, the spread of the electrons in the anode as the thickness of the anode film increases. In some embodiments, the electron beam is focused to a 5 nm or less spot size on the incident surface, and the thin film anode has a thickness of 40 nm or less, 20 nm or less, 10 nm or less, or between 1 and 20 nm, such that the X-ray beam spot size at the exit surface of the thin film anode has a comparable dimension to the desired spatial resolution.

The generated X-ray beam transmits through a sample specimen placed on a stage and disposed a distance D1 from the thin film anode. The sample specimen is placed close to the thin film anode, such that a sample area with a size approximate that of the X-ray beam size is interacted with the X-ray beam. The X-ray beam exits the sample specimen and is collected at an X-ray detector disposed a distance D2 from the sample specimen. D2 is typically many times larger than D1, with the ratio of D2/D1 providing a magnification of X-ray signals from the nanometer sized sample specimen area to be collected by a micrometer sized pixel on the X-ray detector.

In some embodiments, the electron source is disposed in a high vacuum environment, for example a vacuum enclosure having ultra-high vacuum (UHV) as known in the art. Further according to some embodiments, the thin film anode may also be disposed in the UHV environment. An X-ray-transparent window may be provided that isolates the high vacuum environment from the rest of the apparatus that may be disposed in a poor vacuum environment, or in ambient conditions. In a non-limiting example, the X-ray-transparent window comprises beryllium. As the window separates the sample environment from the high vacuum environment of the electron source and the thin film anode, a biological specimen that is not compatible with high vacuum may be imaged from X-ray beams exiting the X-ray transparent window.

In some embodiments, the sample specimen is mounted on a sample holder that separates the thin film anode and the X-ray detector. The sample holder may be a liquid sample holder that is compatible with biological specimens such as tissue samples supported in a matrix, a gel or on a glass slide. In one embodiment, the sample holder, the beryllium window may be integrated with the thin film anode as part of a single package, with the thin film anode comprising a stack of first metal film comprising Cu, Mo, or Au serving as the anode film, and a second metal film comprising Be. The package may further comprise a sample holder attached to the Be film for holding a sample specimen close to the X-ray source at the exit surface of the first metal film in the thin film anode. Such an integrated solution minimizes sample to anode distance D1, and will provide a high magnification as well as isolation between the sample specimen with the thin film anode.

In some embodiments, the electron source is a scanning electron column, for example an electron column from a scanning electron microscope. The scanning electron column focuses a single electron beam in a tight electron beam spot on the incident surface of a thin film anode. The electron beam can be raster-scanned by one or more scan coils in the scanning electron column to incident on different pre-programmed locations along the incident surface of the anode. As the thin film anode has generally uniform thickness and composition along its surfaces, and because the electron beam transmits through the thin film anode in a direction generally normal to the incident surface, the scanning electron beams can be programmed to generate a rastering X-ray beam to image different locations on the sample specimen in two dimensions. In some embodiments, the lateral dimension of the thin film anode is sized such that the scanning electron beam can cover a sufficient anode area for the exiting X-ray beams to cover a range of sizes of interest on the target sample specimen to be imaged. For example, the thin film anode may be approximately 1 inch in size for imaging a similarly-sized IC chip.

In some embodiments, an existing SEM may be modified to house a transmission type thin film anode for X-ray generation and a beryllium window to allow unimpeded transmission of X-rays to the sample, and then, ultimately to the detector. The focused electron beam will have focal spot size <5 nm on the anode.

Embodiments of XN as disclosed herein may be used for nanoscale X-ray phase and absorption contrast imaging of semiconductor integrated circuits as well as tissue specimens using with characteristic X-rays generated by a thin film anode.

In some embodiments, the stage is a movable stage that is controlled by at least one controller. The movable stage may be a multi-axis nano-positioning stage that can provide X,Y,Z range of translation, as well as tilt and rotations. Images obtained via multi-angle illumination from tilting of the stage contain not only information about the phase of the sample specimen (enabling phase contrast imaging and enhanced resolution) but are also partially tomographic in nature, enabling tomosynthesis.

Some embodiments are directed to a system for non-destructively acquiring images using an X-ray microscope and reconstructing the images in 3D using tomosynthesis and computational imaging for "virtual delayering" sample specimens at an isotropic resolution to 10 nm via an overall image magnification of >1000.

Some aspects of the present application are related to nanoscale X-ray imaging of biological specimen. The inventors have recognized and appreciated that in biological and clinical research, there is a need for analytical tools that enable visualization of cell morphology and function at nanometer scale. In contrast to the methods that are available only at large synchrotron facilities, the present application discloses compact, tabletop instruments that could be placed in a research lab, pathology suite or an operating room for fast imaging of tissue specimens with minimal preparation (e.g., a thin, microtome slabs of tissue suspended in a matrix, e.g., Matrigel or paraffin, or presented on a thinned glass slide) in under 15 minutes.

The inventors have recognized and appreciated that the X-ray absorption of most cellular and sub-cellular structures is very similar. Therefore, in a conventional X-ray image utilizing absorption contrast, one cannot visualize low-contrast cellular organelles—primarily made of low atomic number materials such carbon, hydrogen, oxygen and nitrogen—against a background of water and lipids. Aspects of the present application are directed to an imaging system and methods for operating the same for X-ray imaging a biological specimen without the limitations described above.

The imaging systems and methods for using the same to image biological specimens are in many aspects similar to embodiments of the present application for imaging integrated circuits. In some embodiments an imaging system as disclosed herein may be used for imaging both integrated circuits and a biological specimen, as the use of such imaging systems is not so limited to a particular type of samples.

The imaging systems disclosed herein can provide 3D tomographic views of cellular and sub-cellular structures and their interactions with exogenously administered agents. visualize and 3D render microtome slices, several microns in thickness, in their native hydrated state without staining. It will also provide quantitative information about the absorption (i.e., the linear attenuation coefficient) as well the phase (e.g., the real part of the complex refractive index) of the specimen in a tomographic fashion. Some embodiments can provide a spatial resolution of 10 nm, and will be able to localize protein and macro molecular complexes within a cell. In some embodiments, the imaging, without processing and reconstruction, will take no more than 15 minutes. State-of-the-art GPUs may be used for fast, 3D iterative reconstruction of the specimen.

Further according to some aspects, the imaging systems disclosed herein can directly visualize transfection of a cell by a virus particle. Similarly, gene expression and ensuing protein transcription/localization result in alterations in cell structure that can be captured at a resolution of 10 nm. Furthermore, by conducting phase-contrast imaging at this resolution, X-ray nanoscope will enable visualization of the organization, localization, and alterations in the number of sub-cellular structures.

In some embodiments, imaging a biological specimen using an X-ray Nanoscope of the type as disclosed herein includes labeling the biological specimen with one or more labeling agent that can be used as a molecular imaging marker. The labeling agent may comprise a heavy element with a large atomic number Z, for example a metallo-nanoparticle such as Ferumoxytol. In some embodiments, the labeling can be implemented by modifying antibodies in general with gadolinium or other agents.

FIG. 1 is a high-level block diagram of an imaging system 100, in accordance with some embodiments. System 100 includes one or more electron sources 102. In some embodiments, the one or more electron sources are electron gun in an existing SEM that comprises a an emitter and an accelerator capable of accelerating emitted electrons to an energy of tens of keV, for example 10 keV, 20 keV, 30 keV, 40 keV, or between 20 and 50 keV, or between 30 and 100 keV. System 100 also includes electron focusing component 104 that can focus the emitted electron beam to an electron beam spot with a diameter of no more than 10 nm, no more than 5 nm, no more than 2 nm, or between 10 and 1 nm on the incident surface 106A of an thin film anode 106. In some embodiments, electron focusing component 104 may be implemented by one or more coils and apertures of a scanning electron column, as will be described below in relation to FIG. 2.

An electron beam transmits vertically through the thin film anode 106, which generates X-ray beams at the exit surface 106B downward through a beryllium window 108, and through a sample specimen 110 mounted on a nano-positioner as a stage. A high precision platform may serve as nano-positioner of sample specimens such as IC chips or biological specimen. High precision platform may have, for example, 1 nm translation resolution and 7 mm travel in the x-y dimensions, 0.2 nm resolution and 100 μm travel in the z-direction and 360 degrees rotation.

System 100 also includes a high-resolution X-ray detector 116 consisting of an array of sensing elements. Modern imaging detectors for soft X-rays (e.g., cooled CCDs) operate in either direct mode where the X-ray interacts in the silicon pixel, or in indirect mode where a phosphor is deposited on the pixel. In the 10-3D keV energy range, the indirect approach is typically the most practical as it avoids the use of specialized imagers such as deep depletion, back illuminated devices.

In some embodiments, X-ray detector 116 is implemented as a high-resolution camera. The high-resolution camera may be arranged so that the incident X-rays are normal to the plane of the camera chip, minimizing parallax effects in the phosphor. Pixel size, though important for resolution, can to some extent be adjusted through changes in magnification. The large magnification in some embodiments yields a corresponding large number of pixels that must be available for imaging. For example, for an ultimate resolution of 10 nm, a 1 mm ($10^6$ nm) sized imaging area on the sample specimen will have $10^5$ pixels on a side ($10^6$ nm/10 nm pixel size). Therefore 10 Gpixels may be required for storing the image of a 1 mm×1 mm section of an imaged sample specimen, for example with a total of 1000 Gpixels required for imaging an entire IC assuming a 1 cm×1 cm chip size. Multiple such images may be acquired and processed by a tomosynthesis algorithm in accordance with some embodiments, as discussed in more detail below.

Some embodiments utilize reconstruction and imaging that is localized such that it is not necessary to obtain all of the pixels comprising the chip in order to reconstruct a localized area. Although Gpixel arrays have been implemented by stitching together many sensors, some embodiments limit the size of the scanned area on the chip to closely match large commercial chips. Recent work has shown that commercial DSLR cameras can be made to perform at the level of cooled CCDs with the advantage of lower cost and commercial availability. For example, the imager in a modern DSLR camera such as a Nikon D810 is 7360×4912 pixels (36.3 Mpixels) with 4.88 μm pixels. When coupled with a scintillator plate and magnification, such a camera may be used as the detector 116 in accordance with some embodiments. Optical magnification may be used with the DSLR camera to achieve an effective pixel size of 1 micron on the scintillator.

System 100 also includes one or more processing computers 118 comprising at least one processor programmed to perform a tomosynthesis reconstruction of 3D images and one or more one or more displays 120 coupled to processing computer(s) 118 for displaying results of processing performed by processing computer(s) 118. System 100 also includes power and control unit 122 configured to provide operating power to one or more components of system 100.

In FIG. 1, the electron sources, electron focusing components and thin film anode are disposed within a vacuum chamber 112. A beryllium window 108 is disposed on a wall of the vacuum chamber. Any suitable air-tight sealing coupling or material may be used for placing the beryllium window within the wall to maintain a high vacuum of $10^{-6}$ to $10^{-8}$ Torr, for example at about $10^{-7}$ Torr. System 100 also includes a vacuum pump system 113 and a load lock 114 for maintaining vacuum within the vacuum chamber, and for access to inside of the vacuum chamber without completely venting the vacuum chamber. Additionally, one or more electrical ports 115 are provided in walls of the vacuum chamber, such that electrical power and signals may be communicated across the vacuum chamber 112.

In some embodiments, X-ray beams exiting the bottom of the beryllium window travel through air towards the sample specimen, pass through the sample specimen, and then be detected by a high- resolution, photon-counting detector. At very low X-ray energies (<5 keV), there is some attenuation and scattering of X-rays by the intervening air. To address this problem, in some embodiments a short vacuum tunnel, with multiple beryllium windows to house the positioning stage and the detector (not shown) may be provided. This vacuum tunnel can be in low-vacuum (approximately $10^{-4}$ Torr), or be helium filled, and it does not have to be the same vacuum manifold as the main X-ray source housing.

Figure 2:
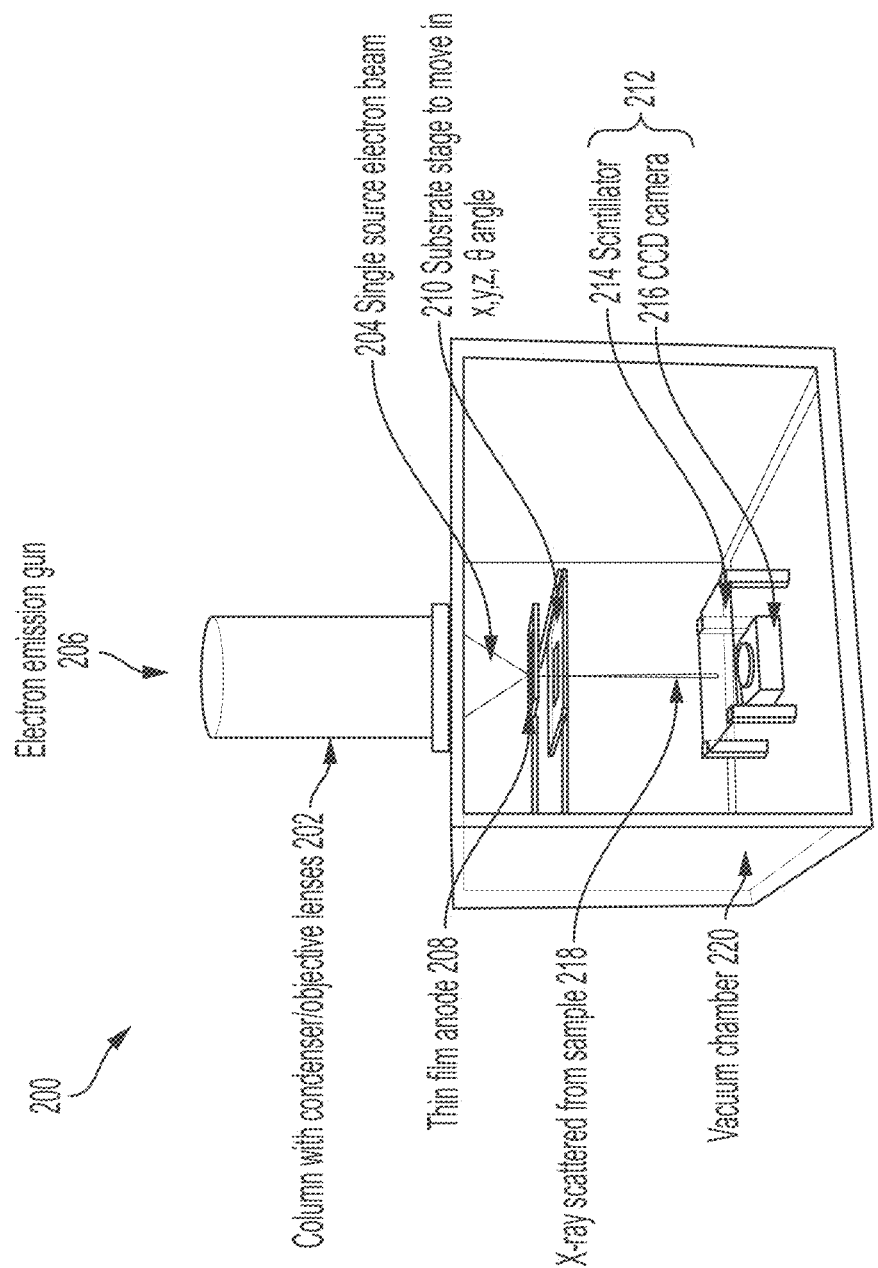
FIG. 2 is a schematic diagram of an exemplary imaging system, in accordance with some embodiments.

FIG. 2 is a schematic diagram of an exemplary imaging system 200, in accordance with some embodiments. Imaging system 200 is based an existing SEM, which comprises a scanning electron column 202 with one or more condenser and objective lenses for focusing an electron beam 204 generated by an electron emission gun 206. The column 202 also comprises X-Y scan coils configured to shift the electron beam spot location. The electron lenses within the column focus the electron beam on a spot on an incident surface of a thin film anode 208 placed in the path of the electron beam in a transmission-type anode configuration. A specimen holder on a substrate stage 210 is disposed beneath the thin film anode and in between an exit surface of the thin film anode and an X-ray detector 212. The X-ray detector comprises a scintillator 214 and a CCD camera 216 for capturing and transmitting image signals for further processing in one or more computers (not shown). In the example illustrated, the thin film anode 208, sample stage 210 and detector 212 are disposed in a vacuum chamber 220.

In some embodiments, the single electron beam from the SEM will be focused down to a less than 5 nm focal spot on a thin copper anode to generate characteristics, partially coherent, nano-focused X-ray beam 218. These X-rays will go through the specimen to form an X-ray image on the detector array with direct X- ray detection. The sample will be placed close to the X-ray source and the detector array will be placed some distance away to obtain magnification. By rastering the electron beam over the anode, a set of X-ray projections with 30 nm pixel size will be created. The increased size of the focal spot takes into account the scattering and distribution of electrons in the thin-film anode.

Thin Film Anode

The thin film anode may be a metal thin film anode placed in the path of the electron beam for X-ray generation. The anode design is a transmission anode in which electrons are incident perpendicular to a thin metal target and characteristic X-rays are emitted from the opposite side of the anode. A transmission anode approach is chosen to maximize the characteristic K or L X-ray lines of the anode material and to minimize bremsstrahlung continuum relative to the characteristic lines. The anode has multiple design criteria including thermal management, minimizing target thickness to maintain spectral "purity" and minimize the X-ray spatial dimension while making a sufficiently thick target to have reasonable X-ray production and, finally, ensure that the incident electron beam is attenuated so that electrons do not reach the specimen under inspection.

Figure 3A:
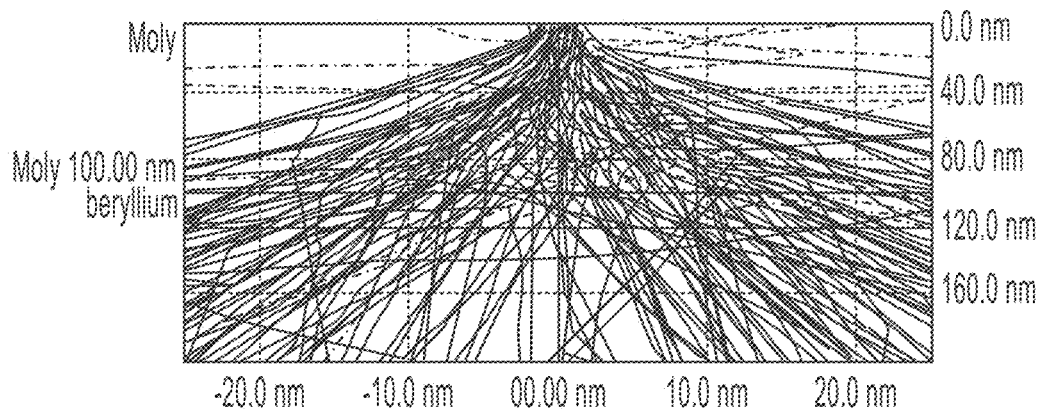
FIG. 3A is a simulated plot illustrating the distribution of 30 keV electrons incident on a 100 nm film of Mo, according to an aspect of the present application.
Figure 3B:
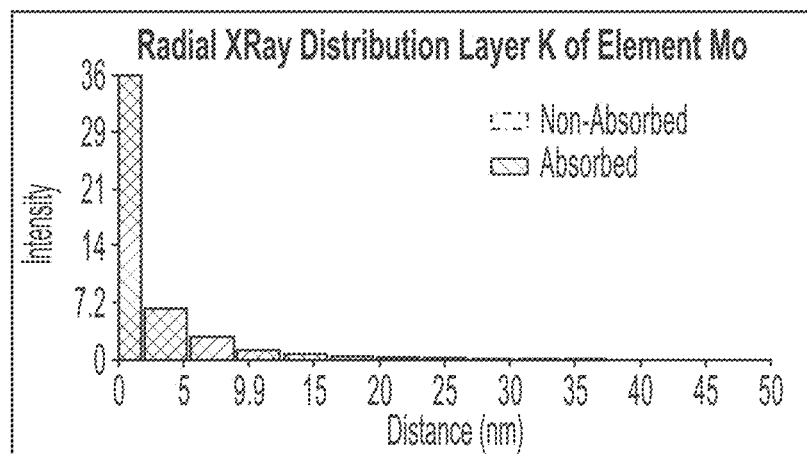
FIG. 3B is a simulated data chart illustrating radial X-ray distribution as a function of distance away from the anode, according to an aspect of the present application.

In some embodiment, the thin film anode consists of a layer of Mo over a Be substrate. The Mo characteristic lines are at 17.48 and 19.61 keV; Be acts as a support and thermal element. FIG. 3A is a simulated plot illustrating the distribution of 30 keV electrons incident on a 100 nm film of Mo, according to an aspect of the present application. FIG. 3B is a simulated data chart illustrating radial X-ray distribution as a function of distance away from the anode, according to an aspect of the present application. All simulations were done using the CASINO 2.4.8.1 code. FIG. 3A shows that the electron beam, initially set at 5 nm diameter, has spread out to 10 nm laterally after approximately 40 nm in depth vertically. The effect of thicker anode materials is to produce an X-ray spot with a broader spread, degrading the spatial resolution and introducing tails as shown on the right.

X-Ray Imaging Detector

According to an aspect, an imaging system disclosed herein may have an X-ray detector capable of 10 nm resolution at the iso-center of the s ample specimen. Since practical X-ray imagers have resolutions of 5 µm or more, a geometrical magnification of 1000 or more is required to obtain 10 nm resolution. Such a magnification is feasible only if the focal spot size of the X-ray beam is 5 nm or less. It should be appreciated that in this model, the size of the pixels on the detector is not important since we can always move the detector out further, increasing geometric magnification. The area imaged on the specimen under examination is therefore dependent only on the total number of pixels in the imager, which favors systems with large numbers of pixels, thereby increasing the area over which data can be acquired and hence throughput. At a resolution of 10 nm, a 1 Mega pixel imager (1 k×1 k) would image a 10 µm×10 µm section of the specimen.

Some embodiments include an X-ray energy range of 30 kVp and below, where it is possible to have either energy-integrating or photon-counting X-ray detectors. In cooled CCD and CMOS imagers, which generally have smaller pixels, the signal is integrated over a frame time and therefore cannot distinguish individual X-rays. On the other hand, photon-counting detectors count individual X-ray photons and bin them according to their energy. Recent developments in these photon-counting X-ray detectors offer several compelling advantages compared to the integrating imager. Typically, the efficiency in the energy range of 1-30 kVp is essentially 100%. More importantly, they are able to resolve the energy of the incoming X-rays, and it is possible to set internal thresholds such that only X-rays within a pre-selected range are detected and counted. By this approach, it is possible to essentially eliminate electronic and other sources of noise in the system. Furthermore, the contribution of the bremsstrahlung continuum part of the incoming X-ray spectrum is greatly reduced, thereby increasing the image contrast. One can think of each energy band in the detector as providing an image that is a monochromatic.

In some embodiments, a time stamped image may be obtained. An interesting result from time stamping, is the potential ability to correct for vibration without compensating mechanical motion. For example, if images are obtained at higher rates than typical mechanical vibration, then successive frames may be dynamically combined to reduce mechanical vibration effects.

Photon-counting detectors are now commercially available as complete assemblies with all electronics and computer interfaces optimized. Some of these systems are optimized to read on a pixel by pixel basis (e.g., Advacam AdvaPIX PTX3™ or Mars Spectral CT) while others read on a frame by frame basis (e.g., Dectris™) The Advacam PTX3 counts each individual event and, using pixel interpolation, can obtain a spatial resolution of 15 micron with 55-micron pixels. Count rates of up to 40 Mpixel/s are possible. The DECTRIS EIGER X 1M camera has 75-micron pixels and can have two energy thresholds set for the individual pixels. For a 1Mpixel camera, up to 3000 frames per second are possible.

X-Ray Optics for 3D Sample Tomography

Figure 5A:
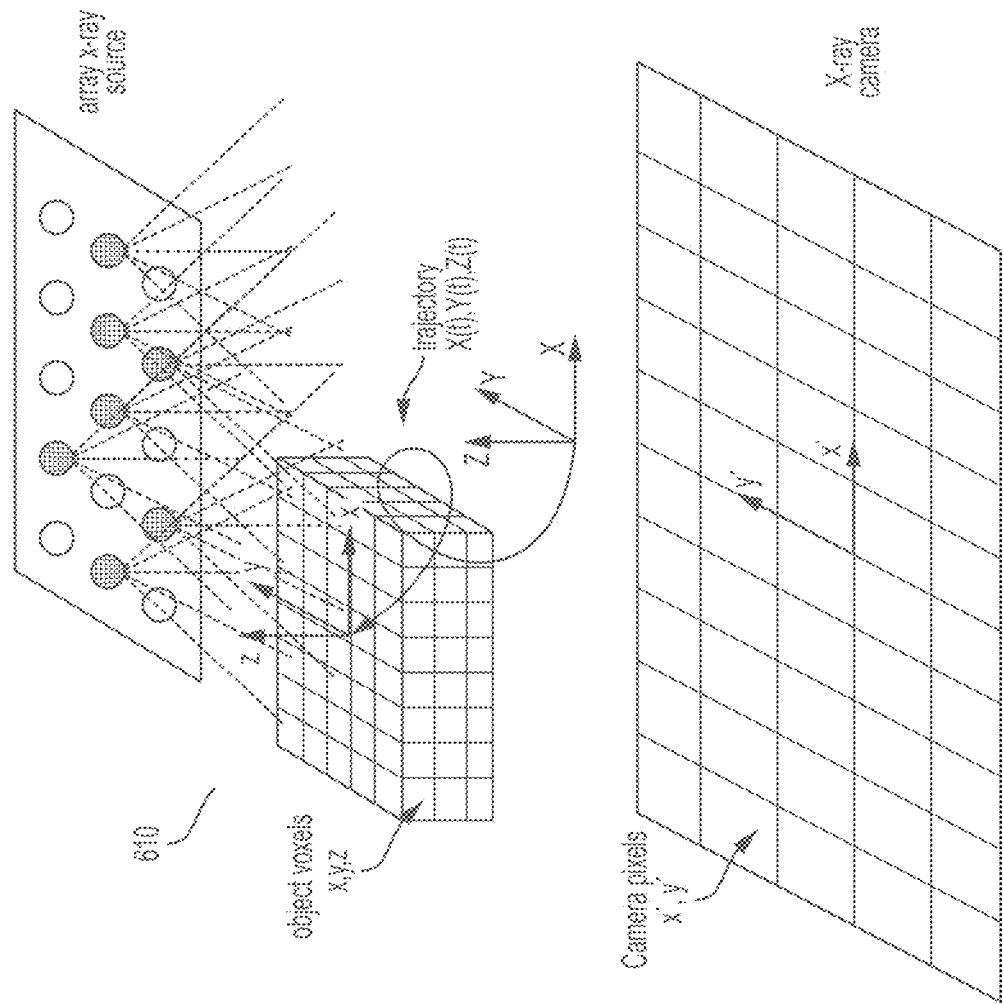
FIG. 5A schematically shows operating principles of an imaging device designed in accordance with some embodiments.

FIG. 5A shows operating principles of an imaging device designed in accordance with some embodiments. As shown, a sample specimen 610 is mounted on a 3-axis stage, and the stage is programmed to execute a trajectory X(t), Y(t), Z(t) as function of acquisition time t. Sample specimen 610 may be an IC die, a biological specimen, or any other suitable target volume for imaging. As the stage moves, sources in the array are turned on and off selectively, while the detector (e.g., X-ray camera) obtains intensity images.

Figure 5B:
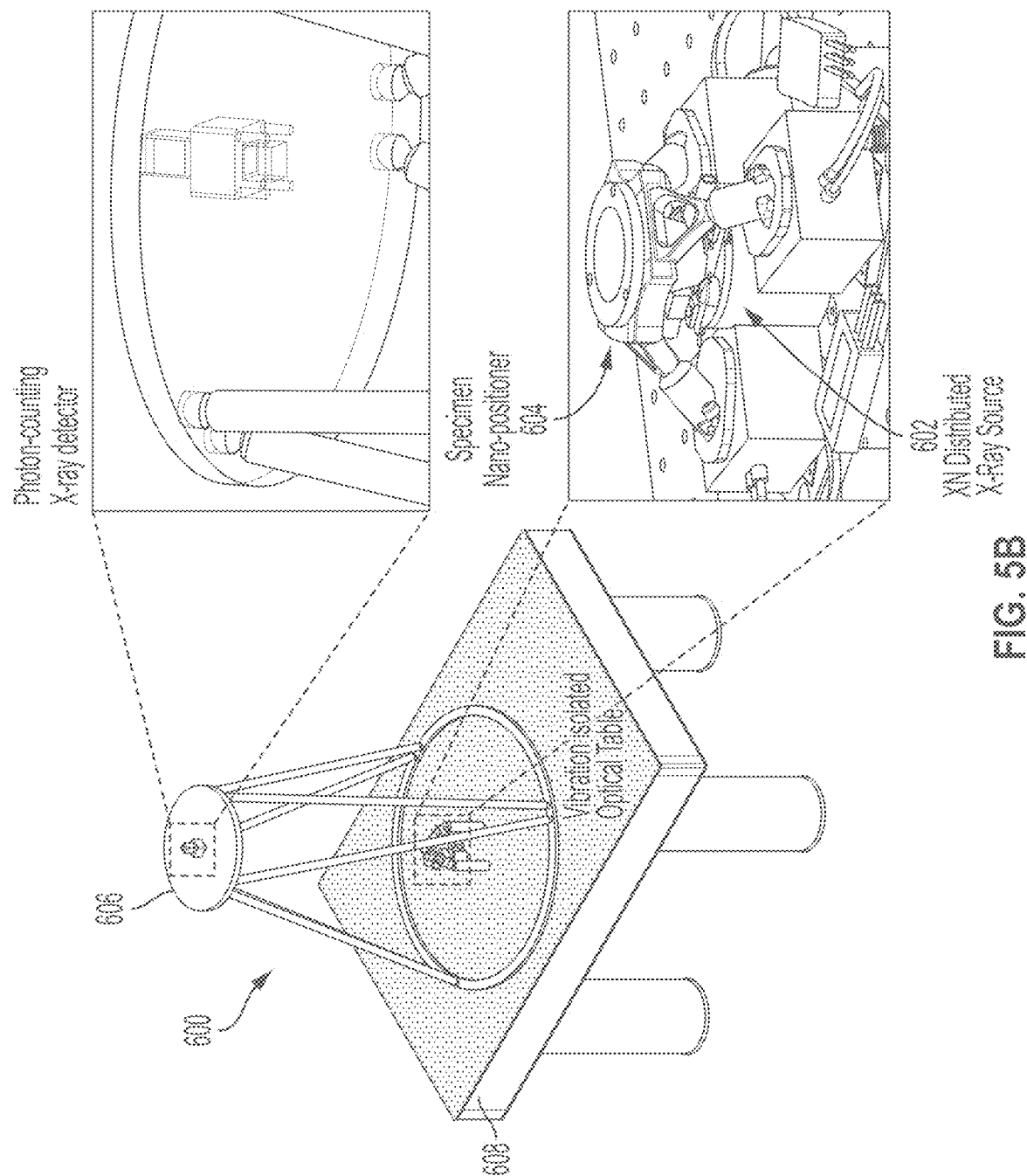
FIG. 5B shows a plan view diagram of an exemplary imaging system 600, in accordance with some embodiments.

FIG. 5B shows a plan view diagram of an exemplary imaging system 600, in accordance with some embodiments. In FIG. 5B, imaging system 600 includes the source 602, specimen nano-positioner 604 and the detector 606, which are placed on a vibration isolated optical table 608.

In the example shown in FIG. 5A, the sources (filled circles) are turned on, whereas all other sources (unfilled circles) are turned off. At the next time step, a different set of sources are turned on to acquire an image at point X(t+1), Y(t+1), Z(t+1) on the trajectory. To avoid motion blur, the stage motion may be programmed to be "step-wise." For example, the stage may have sequential target positions and, every time it reaches a target the stage dwells (stops) until the image is acquired, prior to moving to the next target position. The images may be denoted as $I_{XYZ}$ (x',y'), where (x',y') denotes the coordinates on the detector.

The set of intensities $I_{XYZ}$ (x',y') constitute the captured data used to reconstruct absorption and phase images of the sample specimen in accordance with some embodiments. The absorption and phase images may be denoted as a(x,y,z) and φ(x,y,z), respectively. Here, (x,y,z) denote the coordinates on the sample specimen, and can be thought as "voxels" of size 10 nm×10 nm×10 nm, or some other suitable voxel size. Physically, a(x,y,z) represents loss of X-ray photons due to absorption by atomic nuclei; therefore, at each voxel, a(x,y,z) may be determined primarily by the Z number of the elements within that voxel. On the other hand, φ(x,y,z) is determined by the dipole moment interactions between X-ray photons and the electron clouds of the elements within the voxel. Phenomenologically, this interaction is commonly referred to as "index of refraction," and results in phase delay of the electromagnetic wave as it passes through matter. The interaction may be expressed simply as the complex transmittance ψ(x, y, z)=a (x, y, z)$e^{i\phi(x,y,z)}$. It turns out that the two interactions, absorption and phase delay, are related through the Kramers-Kronig relationship that guarantees causality. Therefore, a(x,y,z) may be written as φ(x,y,z)γ(λ), where γ(λ) is a material- and wavelength-dependent coefficient. This relationship constitutes a strong prior, which is exploited in some embodiments to improve phase contrast from weakly absorbing objects.

The nature of the interactions a and φ determine the "forward operator," which may be denoted as H. To construct H, two approximations are commonly used: the Born approximation, which assumes a weak phase object; and the Rytov approximation, which assumes weak gradients in the object's phase. The Rytov approximation is commonly used in the X-ray regime, as typically the weak gradient assumption is satisfied, whereas the phase delays may actually be significant. Some embodiments test this assumption against rigorous models as well as lab-bench experiments with known (calibrated) targets; and incorporate corrections into the construction of the forward operator. Assuming that the Rytov model holds, the phase of the field after propagating through the object may be expressed as:

$$\chi(\vec{r}'') = \frac{1}{g_{inc}(\vec{r}'')} \int \int \int_{\substack{object \\ volume}} g_{inc}(\vec{r})(1 - \phi^2(\vec{r}))G(\vec{r}'' - \vec{r})d^3\vec{r}, \quad (1)$$

where $g_{inc}$ ($\vec{r}$) is the incident field; G ($\vec{r}$) is Green's function of free space; and $\vec{r}$=(x, y, z), r'=(x", y") are the coordinates within the object volume and on plane immediately beneath the object, respectively. The operator H is finally constructed by propagating the resulting attenuated and phase-delayed field from the plane $\vec{r}'$=(x", y") to the detector (e.g., camera) plane if $\vec{r}'$=(x', y'). The build-up of the forward operator H is complemented in some embodiments with experimental measurements, especially of the depth point spread function (PSF) as a spatially variant function under a certain limited scanning geometry, to improve the condition of the inverse problem.

Image Acquisition and Tomosynthetic Reconstruction

In some embodiments, the sample specimen is mounted on a high-precision nano-positioning stage, an example of which is discussed above in connection with FIG. 1. The mounted sample specimen may be sequentially exposed to X-ray illuminations in a coded fashion as discussed above. The X-ray optical chain described above in connection with FIG. 1 focuses the X-ray beam on a high-resolution detector in order to provide a set of projection images of the sample specimen such as an IC chip or a biological specimen. In some embodiments, these projection images are reconstructed into a 3D image stack of planar images using a tomosynthesis algorithm.

Some embodiments combine coded source (structured) illumination, with strong priors applicable to ICs to define a tomosynthesis algorithm as an inverse problem, as follows:

Given the set of measurements $I_{XYZ}$(x',y'), find the complex transmittance ψ(x,y,z) that minimizes the Error Functional $$\|I_{XYZ}(x',y') - H\psi(x, y, z)\|^2 + \mu R(\psi), \quad (2)$$

where $R(\psi)$ is a regularizer expressing prior knowledge about the complex transmission function, as discussed in more detail below, and $\mu$ is the regularization parameter. Alternatively, the problem may be posed as one of constrained optimization:

$$\text{Minimize } R(\psi) \text{ subject to } \|I_{XYZ}(x', y') - H\psi(x, y, z)\|^2 < \varepsilon, \quad (3)$$

where $\varepsilon$ is a "robustness" parameter expressing confidence in the final estimate deviating from the data in order to avoid over fitting.

A broad range of optimization techniques are available for tackling this class of problems, e.g. TwIST for (2), Matching Pursuit and its variants (e.g., Orthogonal Matching Pursuit) for (3), and others. Different techniques can be compared in terms of performance, including accuracy of reconstruction with simulated and calibration samples; and in terms of convergence speed.

The choice of regularizer $R(\psi)$ may be important. If $\psi$ belongs to a class of objects that can be expressed sparsely, i.e., a set of basis functions exists such that the projection of $\psi$ to this set yields very few non-zero coefficients, then equations (2) and (3) can be proven to converge to the correct solution with probability near 1 even if the measurements are severely undersampled. A limit indeed exists as to how many samples are required at the minimum to obtain the high quality reconstruction; below this limit, the reconstruction typically fails. However, most classes of objects of interest are indeed "sparsifiable," i.e., a set of basis functions does indeed exist in which the objects in the class are sparse.

Sparsity criteria can be very general. In the case of IC dies that are of interest for imaging with an imaging system designed in accordance with some embodiments, priors that can be translated into sparsity are: the Manhattan geometry of the ICs; the layering into equally spaced, parallel layers; and the presence of a limited number of elements whose indices of refraction in the X-ray regime has been tabulated for various stoichiometries and obey the phase-attenuation duality relationship. Moreover, the random multiplexing of several sources at each measurement, as shown in FIG. 5A, meets the "incoherence" criterion of compressive sensing. Optimization schemes generally allow for the inclusion of other constraints, e.g. positivity of the absorption coefficient a(x,y,z), In some embodiments, an ad hoc approach is applied to determine the regularizer $R(\psi)$ according to the criteria described above. This technique has yielded good results in prior work. To further enhance resolution, some embodiments adopt a "learning-enhanced inversion" approach. Some embodiments train a compressed representation of imaged ICs (e.g., an overcomplete dictionary or set of neural network hidden units) using high-resolution images of sample/representative ICs. The dictionary may be used to denoise and enhance the resolution of the computationally reconstructed images. Dictionary learning is particularly suitable for some embodiments since the number of elements in an IC should be limited and the patterns of these elements should be easy to learn.

A tomosynthesis algorithm in accordance with some embodiments is capable of classifying each voxel (e.g., according to material composition, part of a standard circuit component such as a logic gate, etc.) for identifying areas of interest. These computational imaging and learning-enhanced approaches yield a "compressive" gain, defined as:

G=number of voxels(unknowns)in the object/number of measurements.

As a rule of thumb, the number of measurements required to obtain a 3D reconstructed image approximately equals the number of voxels desired to reconstruct, i.e., G≈1; in turn, that is determined by the desired resolution. For an IC of lateral size 1 mm×1 mm and thickness 100 μm, and desired resolution of 10 nm×10 nm×10 nm, 50,000×50,000×5000 voxels are required. Collecting so many measurements is typically impractical; instead, by using sparse representations and the inversion formalisms using equations (2) or (3) in accordance with some embodiments, the same amount of information may be obtained but with a much smaller number of measurements, i.e. G>>1. Because there are limited number of elements in the IC images, the image representation are generally sparse, and the compress gains in the Table 1 below may be achieved in some embodiments.

Figure 4:
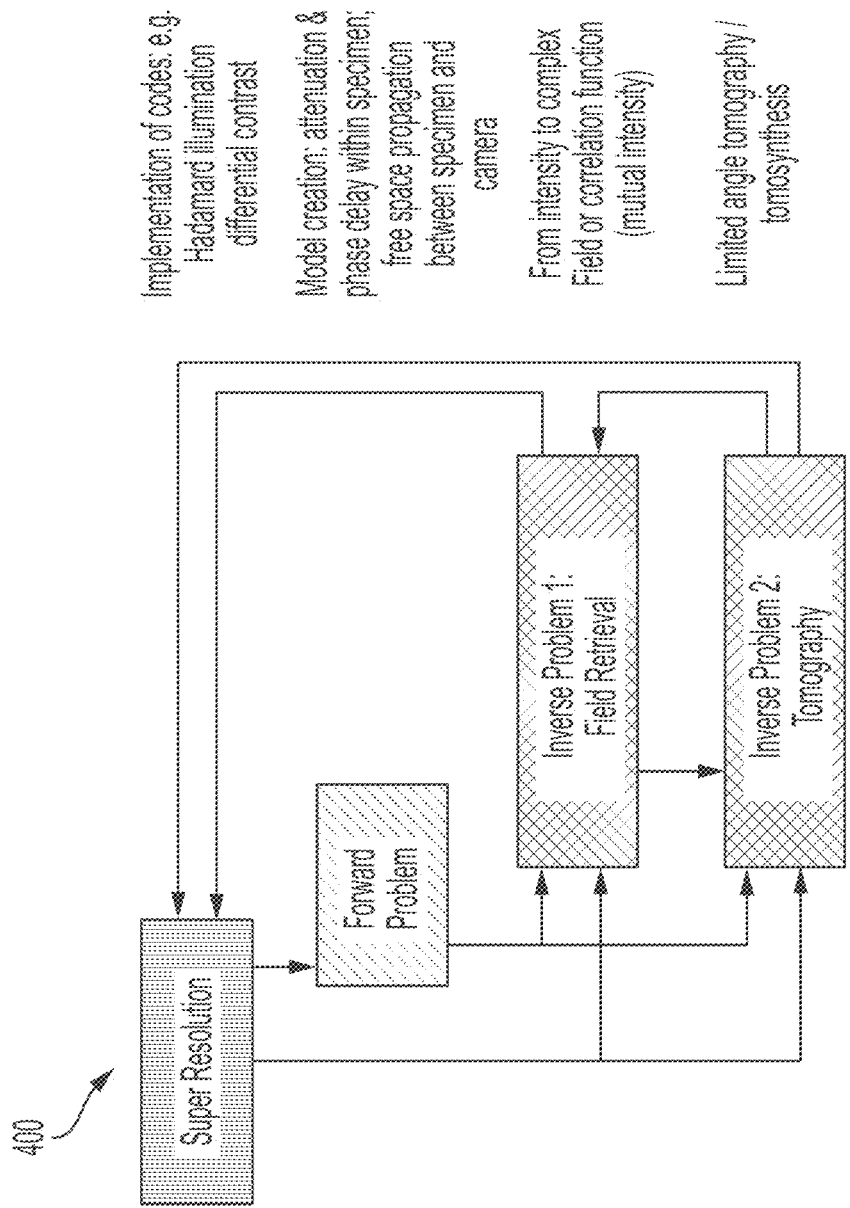
FIG. 4 is a schematic flow diagram showing an exemplary process 900 for computational imaging and reconstruction of a biological specimen, in accordance with some embodiments.

FIG. 4 is a schematic flow diagram showing an exemplary process 400 for computational imaging and reconstruction of a biological specimen, in accordance with some embodiments. In such embodiments, The goal of computational imaging activity is the reconstruction of the cellular structure of the specimen with the desired resolution of 10×10×10 nm-cube, using the intensity images obtained from the optical chain.

FIG. 4 illustrate several components of process 900, which are discussed in detail below.

Design of illumination: To capitalize on the new flexibility offered by the distributed source, we will design illumination patterns, to be used in sequence as the specimen is being mechanically scanned and rotated. The patterns will be optimized to work with the remaining computational imaging components.

Forward problem: This is a rigorous simulation-based model of X-ray propagation through a specimen, assuming an internal structure is given. Of course, the purpose of this program is to image unknown specimen; however, the step of developing the "forward operator" is essential for the next steps, as we detail below.

Inverse Problem: Utilizing knowledge of the forward operator, and with the designed illumination patterns from the previous two components, this part of the computational engine converts a sequence of "raw images" (i.e., intensity patterns detected at the camera) into the estimate of the tomographic structure of the specimen. This is accomplished in two sub-steps:

Inverse problem part 1, field retrieval: The first step is to convert the raw intensity images into estimates of the complex field (amplitude and phase; or real and imaginary part) that emerged from the specimen in any given measurement. At first, it might appear that there is not enough information to go from a real positive measurement to a complex estimate; to overcome that limitation, we will use advanced machine learning algorithms that exploit the specimen structure and material composition.

Inverse problem part 2, tomography: The second step is to collect the complex field estimates (from part 1) at multiple specimen positions and rotations and use them to estimate the specimen's internal structure. We will carry it out using advanced compressive sensing algorithms as well as machine learning.

Reconstruction Sub-system: a tomosynthesis reconstruction algorithm for layer-by-layer structure of a sample using an iterative reconstruction method and advanced post image processing techniques may be used. In one implementation, an iterative image reconstruction is used.

Experimental calculations for performance estimates

To determine the acquisition time required to image an IC chip, the expected exposure time per image and total number of images required for reconstruction were computed. The results are summarized in Table 1.

| Resolution | Reconstruction volume | Detector Resolution | Compress gain | Exposure time | Acquisition time |
|---|---|---|---|---|---|
| 20 nm | 50,000 × 50,000 × 2500 | 3000 × 3000 | 20 | 38.4 s 1.92 s | 15.43 days 18.5 hours |
| 10 nm | 100,000 × 100,000 × 5000 | 3000 × 3000 | >20 | <1.92 s | <6.2 days |
| 10 nm | 100,000 × 100,000 × 5000 | 3000 × 3000 | >20 | <1.92 s | <6.2 days |

The photon flux at each detector pixel as function of number of photons generated by each nano-focused source is $$P_{detector} = P_{source} M \eta e^{N \mu d},$$

where $P_{detector}$ is the intensity at the detector, $P_{source}$ is the intensity of the source, M is the number of sources simultaneously illuminating the detector, η is the fraction of photons emitted per source that are captured by the detector (for a 1 μm pixel size and a 1 cm source-to-detector distance, $\eta = 7.958 \times 10^{-10}$), and $e^{N \mu d}$ is the transmission coefficient of the IC. For a 5 nm focal spot size, an imaging system in accordance with some embodiments is expected to deliver 10 mW of power per anode. The estimated photon production efficiency of the system is 1%. The expected photon intensity that the source emits in all directions ($P_{source}$) is $6.242 \times 10^6$ photons/s.

To estimate the attenuation introduced by the IC, a representative IC for which the silicon substrate has been thinned to 50 μm, and consisting of: a 50 μm thick silicon substrate, 26 layers of 100 nm thick silicon nitride, and 13 layers of 100 nm thick copper vias was considered. The transmission coefficient for this IC at 10 keV X-ray energies is 0.5243.

On average it is expected to capture 1000 X-ray photons per pixel to generate a useable image with noise variance. For M=1, or single source imaging, this results in an exposure time of 38.4 s. To further increase the photon flux and decrease the required exposure time, coded illumination patterns with M~20 may be used, resulting in an exposure time of 1.92 s.

To calculate overall acquisition time, the number of images necessary to reconstruct the IC region of interest was considered. High-resolution X-ray detectors typically provide 9 megapixels of resolution. An IC having a region of interest of 1 mm×1 mm×0.05 mm was assumed. Aiming at a "compressive gain" of 20× and using the multiple images acquired on the spiral-like trajectory of FIG. 5A to obtain the rest of the necessary data, the expected acquisition times of Table 1 were calculated. In some embodiments, exposure time may be reduced by improvements in source flux, detector efficiency, and/or optimization of the imaging geometry. Compressive gain may also improve as machine learning algorithms are incorporated.

To achieve the lateral resolution required for IC imaging, some embodiments combine geometric magnification with computational imaging. Starting with a detector pixel pitch of 1 μm, geometric magnification is used in some embodiments, as shown in FIG. 1. In some implementations, a magnification factor of 12.5-100 may be used, resulting in an effective pixel size of 10-80 nm. To increase the resolution of the system, computational imaging using structured illumination from the X-ray source may be used with one or more of the inversion tomosynthetic algorithms discussed above. Coded illumination and synthetic aperture imaging have been shown to improve effective resolution by a factor of 4 in each direction, and by exploiting the additional strong priors of Manhattan geometry, phase-attenuation duality, and material composition, further gains in resolution are achievable. Using conservative estimates, a system designed in accordance with some embodiments will achieve a lateral resolution of 2.5-20 nm.

For computational imaging, unlike direct imaging techniques such as confocal microscopy, the vertical resolution is not as clearly defined as the lateral resolution. It is useful to consider the depth of field of the system as a loose lower bound to the vertical resolution. For computational imaging methods such as coded illumination and tomosynthesis, the effective numerical aperture of the system is much larger than the numerical aperture of the optical system because many views of the object are captured from many angles or patterns of illumination. In tomosynthesis reconstruction, this effect manifests as a blurring between reconstruction planes. Compressive tomosynthesis methods have been shown to greatly improve vertical resolution, allowing for reconstruction slices at a resolution comparable to the lateral resolution. The techniques described herein combine features from ptychography and compressive tomography in conjunction with strong priors, and, optionally, learning-enhanced inversion methods; hence, the vertical resolution of a system designed in accordance with some embodiments will achieve a vertical resolution approximately equal the lateral resolution (e.g., 2.5-20 nm).

One aspect of the present application is directed to a novel X-ray nanoscope (XN) imaging technology in 2D projection domain as well as using limited angle tomography (i.e., Tomosynthesis) and 3D computed tomography for imaging biological specimen. Examples are provided herein for testing biological and preclinical applications using such imaging systems. In some embodiments, a labeling agent comprising a heavy or high atomic number element is provided to label the biological specimen prior to imaging on the stage to enhance molecular contrast in biological samples.

First Example of Biological Testing: Imaging Cellular Uptake of Metallo-Nanoparticles Detectable by the X-ray Nanoscope The inventors have recognized and appreciated that a number of nanoparticle formulations have been developed and several of them have progressed to clinical trials. Well over a thousand patients have now received chemically distinct, nano-encapsulated chemotherapeutics, generally showing lower toxicity, increased tumoral accumulation of payloads and occasionally improved progression-free survival. However, cures have been rare and most of these cancers will ultimately become resistant, therefore highlighting the need for new strategies and a basic understanding on how these materials work in cells. For example, very little is known about i) how and in which cells these nanomaterials accumulate in to elicit their effect, ii) what the rules are to improve efficacy so that new preparations can be designed rationally rather than empirically, and whether one could predict who will respond to a given therapeutic nanoparticle (TNP) in the clinic. The goal of this example is to perform analyses of a model X-ray dense nanoparticle at the single cell level to address key questions on distribution and accumulation.

In one embodiment, ferumoxytol, an iron containing dextran coated nanoparticle (NP) is chosen as a labeling agent for X-ray imaging, although it should be appreciated that other labeling agent known in the art to be suitable for labeling biological specimen with a heavy element can also be used and aspects of the present application is not limited to ferumoxytol. The choice of ferumoxytol was in part driven by several considerations. For example, FDA has approved this product as a drug (Feraheme). The iron core within ferumoxytol will be directly detectable by XN and the nanoparticle primarily targets macrophages. The inventors have also appreciated and recognized that fluorescent versions of ferumoxytol may additionally be used to provide a correlation study between X-ray image obtained from an X-ray nanoscope to flow cytometric data and microscopy. Ferumoxytol as a labeling agent has been demonstrated to have sustained and rapid (within minutes) uptake into macrophages and can thus be used for clinical macrophage assessment by magnetic resonance imaging (MRI) or generically to image inflammation. A major clinical obstacle however, has been the difficulty to interpret MR images as the cellular distribution and compartmentalization of Feraheme was largely unknown and had relied on occasional histopathology correlation (iron stains are not very sensitive). The introduction of fluorescent Feraheme nanoparticles and high resolution intravital microscopy has shed some light on the behavior of these imaging nanoparticles, but more work remains to be done through the use of an X-ray nanoscope (XN) as outlined below.

One aspect is directed to in vivo labeling of innate immune cells in inflammation. In one example, to test if NPs label innate immune cells, murine bone marrow derived macrophages and brain microglia are first incubated with an NP called CLIO (cross-linked iron oxide nanoparticles) conjugated with the fluorescent probe FITC. The labeled cells are imaged with confocal microscopy and assessed CLIO uptake in the cells by flow cytometry.

Neuroinflammation is induced using encephalitogenic proteins in mouse brains and injected CLIO intravenously. It is found that CLIO preferentially labeled innate immune cells (macrophages and microglia) but not adaptive immune cells in the inflamed brain.

Another aspect is directed to in vitro cellular XN imaging to investigate ferumoxytol uptake in macrophages. In an example, to determine the compartmentalization and effect of iron cores in single macrophages on XN imaging, bone marrow derived macrophages or RAW 264.7 cells may be pulse incubated with ferumoxytol-VT680 at 0, 100 µg/mL, and 500 µg/mL in DMEM with 10% fetal bovine serum (FBS). Samples will be collected at the following time points to determine the time course of ferumoxytol processing in living macrophages: pre-incubation, 10 min, 30 min, 1 hour, 4 hours, 8 hours, and 24 hours after incubation. The cell suspensions will be washed with media and then re-suspended to remove extracellular ferumoxytol at each time point. The final suspension will be imaged on the X-ray nanoscope to obtain cellular images. After imaging, the samples will undergo flow cytometry to quantify the degree of ferumoxytol uptake in the macrophages. The flow cytometric data will be correlated with the cellular imaging data.

Yet another aspect is directed to 3D cellular tomographic imaging of macrophage trafficking in a mouse model of wound healing. In some embodiments, XN phase imaging information may be used in the clinical environment. For example, ferumoxytol in vivo in a wound healing mouse model may be used to track the trafficking of macrophages into the wound over time. The mice will be imaged on days 1, 4 and 7 after injury with MR imaging. 20 mg of Fe/kg of ferumoxytol-VT680 will be administered intravenously via the tail vein. The mice will be imaged at the time point of highest uptake guided by the in vitro testing above. MR imaging will be performed on a 7T small animal MRI scanner (Bruker, Billerica, Mass.) with a dedicated mouse body coil. The size of the wound will be measured by photomicrograph taken after imaging.

X-ray cellular imaging may be performed in addition to MR imaging, such that the same biological specimen such as tissues may be analyzed by more than one imaging technique and the results correlated to produce more accurate diagnostic results than a single imaging technique alone. For example, after MR imaging, the mice will be euthanized, excised wounds will be bisected in the caudocranial direction and embedded in O.C.T. compound (Sakura Finetek) and snap-frozen in a 2-methylbutane bath on dry ice. Tissue blocks (20 µm) of the wound will be prepared and imaged on the X-ray nanoscope.

Flow cytometry may also be performed and to correlate with imaging results. For example, following XN imaging, the tissue block may be processed into single cell suspensions for flow cytometry to quantitatively determine the degree of macrophage uptake of ferumoxytol. Through these procedures, we will be able to directly visualize how ferumoxytol cellular uptake in macrophages changes as wound injury evolves and heals, and correlate to how such change affects the in vivo MRI visualization of nanoparticles and macrophage trafficking.

Second Example of Biological Testing: Imaging Lymphoma Samples and Rituximab-CD20 Interaction Rituximab is a well-characterized, chimeric monoclonal antibody that targets the protein CD20, which is widely expressed on B cells at most stages of development. The binding of Rituximab to B cells results in apoptosis of both malignant and normal B cells that express CD20. For this reason, Rituximab is utilized as a biologic to treat B-cell lymphoma, and other B-cell mediated disorders, such as rheumatoid arthritis, idiopathic thrombocytopenic purpura and myasthenia gravis.

The inventors have recognized and appreciated that it is possible to modify antibodies in general, and rituximab in particular, with gadolinium or other heavy element, such that the modified antibodies act as labeling agents. Fluorescent and paramagnetic/X-ray dense chelator versions of rituximab (rituximab-VT680; rituximab-DOTA-Gd) have been developed as reported in Pathania et. al., Holographic assessment of lymphoma tissue (halt) for global oncology field applications. Theranostics. 2016; 6:1603-1610; and Turetsky et. al., On chip analysis of cns lymphoma in cerebrospinal fluid. Theranostics. 2015; 5:796-804. These versions of rituximab will allow us to image in real time using an X-ray nanoscope i) the cellular association and ii) resultant cellular changes at high spatial and temporal resolutions. The X-ray signatures of labeled vs unlabeled rituximab may also studied and compared through phase contrast imaging.

According to an aspect, two strategies may be employed to evaluate the ability of an XN to directly visualize the interaction between a therapeutic agent (rituximab) and its target on B cells (CD20).

The first strategy is in-vitro assessment of cellular tomography via the use of XN. Interactions between rituximab-Gd, rituximab and CD20 expressed by a monomorphic population of B cells may be directly visualized in-vitro. To this end, Daudi cells (ATCC CCL-213), a Burkitt cell line with robust CD20 expression, will be cultured in RPMI with 10% FBS and 1% pen/strep antibiotic. Rituximab analogs will be added to each culture at concentrations of 0, 30 nM or 60 nM. Similarly, K562 cells (ATCC CCL-243) a CD20 negative leukemic cell line, will be utilized as a CD20 negative control cell line. Six aliquots of each culture will be obtained at several time points (1 hour prior to rituximab; and 1 hour, 4 hour and 8 hours after administration). Aliquots will be either placed in a cuvette for evaluation of rituximab binding using XN imaging or incubated with a FITC-conjugated secondary antibody and assessed by flow cytometry for rituximab binding. Rituximab binding will be qualitatively and quantitatively assessed by review of changes in the cellular morphology observed by cellular imaging using XN at each concentration of rituximab and time-point assessed. Data obtained from XN images with regards to rituximab binding will then be directly compared with binding data (e.g., percent of cells bound to Rituximab) obtained by flow cytometric analysis.

In a second strategy, rituximab binding after in-vivo administration will be studied, to assess the ability of cellular imaging using XN to accurately quantify drug binding after its in-vivo administration and in the context of a heterogeneous population of cells. Patient-derived xenografts models of Daudi cell lines may be used, as well as primary human lymphomas (e.g., diffuse large B-cell lymphoma). Established patient derived xenograft models generated by tail vein injection of Daudi cell line or primary lymphoma cells (diffuse large B cell lymphoma) into SCID mice will subsequently be treated with Rituximab by tail vein injection. Peripheral blood will be obtained from each animal 5 days prior and 24 hours after initiation of Rituximab therapy. Peripheral blood samples will be assessed for Rituximab binding by cellular tomography as well as by flow cytometric analysis after incubation with FITC-conjugated secondary antibody targeting Rituximab. Quantification of Rituximab binding based on XN imaging will be directly compared analogous quantification of binding by flow cytometry. With this approach, we will be able to directly evaluate the ability of cellular imaging to assess drug-target interactions occurring after in-vivo drug administrations. In addition, we will be able to assess the XN technology's ability to analyze cellular morphologic changes related to drug binding in the context of a heterogeneous population of peripheral blood cells of various sizes and levels of target expression.

In addition to assessment of drug-target interactions, another aspect is directed to medical applications of XN imaging for assessment of pathological specimen. High resolution volumetric XN imaging of core biopsy samples of lymphoma specimen obtained from the above mouse models and/or surgical specimen may be performed. These imaging results will allow for a "preprocessing" of entire samples prior to cutting and directing attention to areas of interest. Assessing an entire tissue specimen using XN may facilitate study of tissue heterogeneity and phase contrast in surgical samples.

The above-described embodiments can be implemented in any of numerous ways. For example, the embodiments may be implemented using hardware, software or a combination thereof. When implemented in software, the software code can be executed on any suitable processor or collection of processors, whether provided in a single computer or distributed among multiple computers. It should be appreciated that any component or collection of components that perform the functions described above can be generically considered as one or more controllers that control the above-discussed functions. The one or more controllers can be implemented in numerous ways, such as with dedicated hardware or with one or more processors programmed using microcode or software to perform the functions recited above.

In this respect, it should be appreciated that one implementation of the embodiments of the present invention comprises at least one non-transitory computer-readable storage medium (e.g., a computer memory, a portable memory, a compact disk, etc.) encoded with a computer program (i.e., a plurality of instructions), which, when executed on a processor, performs the above-discussed functions of the embodiments of the present invention. The computer-readable storage medium can be transportable such that the program stored thereon can be loaded onto any computer resource to implement the aspects of the present invention discussed herein. In addition, it should be appreciated that the reference to a computer program which, when executed, performs the above-discussed functions, is not limited to an application program running on a host computer. Rather, the term computer program is used herein in a generic sense to reference any type of computer code (e.g., software or microcode) that can be employed to program a processor to implement the above-discussed aspects of the present invention.

Various aspects of the present invention may be used alone, in combination, or in a variety of arrangements not specifically discussed in the embodiments described in the foregoing and are therefore not limited in their application to the details and arrangement of components set forth in the foregoing description or illustrated in the drawings. For example, aspects described in one embodiment may be combined in any manner with aspects described in other embodiments.

Also, embodiments of the invention may be implemented as one or more methods, of which an example has been provided. The acts performed as part of the method(s) may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed. Such terms are used merely as labels to distinguish one claim element having a certain name from another element having a same name (but for use of the ordinal term).

The phraseology and terminology used herein is for the purpose of description and should not be regarded as limiting. The use of "including," "comprising," "having," "containing", "involving", and variations thereof, is meant to encompass the items listed thereafter and additional items.

Having described several embodiments of the invention in detail, various modifications and improvements will readily occur to those skilled in the art. Such modifications and improvements are intended to be within the spirit and scope of the invention. Accordingly, the foregoing description is by way of example only, and is not intended as limiting. The invention is limited only as defined by the following claims and the equivalents thereto.

What is claimed is:

1. An imaging apparatus for imaging a sample specimen, the imaging apparatus comprising:
    an electron source configured to generate an electron beam along a first direction;
    an X-ray source comprising a thin film anode configured to receive the electron beam at an electron beam spot on the thin film anode, and to emit an X-ray beam substantially along the first direction from a portion of the thin film anode proximate the electron beam spot, such that the X-ray beam passes through the sample specimen; and an X-ray detector configured to receive the X-ray beam that passes through the sample specimen, wherein the X-ray beam has a spot size of between 1 and 20 nm at an exit surface of the thin film anode.

2. An imaging apparatus for imaging a sample specimen, the imaging apparatus comprising:

an electron source configured to generate an electron beam along a first direction;

an X-ray source comprising a thin film anode configured to receive the electron beam at an electron beam spot on the thin film anode, and to emit an X-ray beam substantially along the first direction from a portion of the thin film anode proximate the electron beam spot, such that the X-ray beam passes through the sample specimen; and an X-ray detector configured to receive the X-ray beam that passes through the sample specimen, wherein the thin film anode has a thickness of between 0 and 100 nm.

3. The imaging apparatus of claim 2, wherein
the thin film anode comprises Cu, Mo, or Au.

4. The imaging apparatus of claim 2, wherein
the thin film anode comprises a stack of a first metal film on a second metal film, wherein the first metal film comprises Cu, Mo, or Au, and the second metal film comprises Be.

5. The imaging apparatus of claim 1, wherein the electron source is an electron column of a scanning electron microscope (SEM) and is configured to focus the electron beam at the electron beam spot.

6. The imaging apparatus of claim 5, wherein the electron column is configured to have an acceleration voltage of at least 20 KeV, such that a size of the electron beam spot on the thin film anode is between 1 and 5 nm.

7. The imaging apparatus of claim 1, further comprising at least one controller configured to:

acquire a set of intensity data from the X-ray detector; and
generate an X-ray image representative of the sample specimen based on the acquired set of intensity data.

8. The imaging apparatus of claim 7, wherein the electron source comprises one or more scan coils, and wherein the at least one controller is further configured to:

control translation of the electron beam spot along an x-y plane parallel to a surface of the thin film anode by adjusting signals applied to the scan coils.

9. The imaging apparatus of claim 8, further comprising a movable stage, wherein the at least one controller is further configured to control tilting, rotation, translation of the movable stage or combinations thereof, and move the movable stage and the electron beam spot during operation of the imaging apparatus to acquire the set of intensity data by the X-ray detector.

10. An imaging apparatus for imaging a sample specimen, the imaging apparatus comprising:

an electron source configured to generate an electron beam along a first direction;

an X-ray source comprising a thin film anode configured to receive the electron beam at an electron beam spot on the thin film anode, and to emit an X-ray beam substantially along the first direction from a portion of the thin film anode proximate the electron beam spot, such that the X-ray beam passes through the sample specimen; and an X-ray detector configured to receive the X-ray beam that passes through the sample specimen, wherein the X-ray detector comprises a scintillator plate and magnifying optics to achieve an effective pixel size of 1 µm or smaller.

11. An imaging system for imaging a biological specimen, the imaging system comprising:

a scanning electron column configured to generate an electron beam along a first direction;

an X-ray source comprising a thin film anode configured to receive the electron beam at an electron beam spot on the thin film anode, and to emit an X-ray beam substantially along the first direction from a portion of the thin film anode proximate the electron beam spot, such that the X-ray beam passes through the biological specimen;

a vacuum enclosure arranged to substantially maintain a vacuum between the scanning electron column and the X-ray source;

an X-ray detector configured to receive the X-ray beam that passes through the biological specimen; and a sample holder between the thin film anode and the X-ray detector and configured to separate the biological specimen from the vacuum maintained in the vacuum enclosure.

12. The imaging system of claim 11, wherein
the X-ray beam has a spot size of between 1 and 20 nm at an exit surface of the thin film anode.

13. The imaging system of claim 11, wherein
the thin film anode has a thickness of between 0 and 100 nm.

14. The imaging system of claim 13, wherein
the thin film anode comprises Cu, Mo, or Au.

15. The imaging system of claim 14, wherein
the X-ray source further comprises a substrate where the thin film anode is disposed thereon, wherein the substrate comprises Be.

16. The imaging system of claim 11, wherein
the X-ray source further comprises a thin membrane window separating the thin film anode from the sample holder, wherein the thin membrane window is impermeable to gas or liquid.

17. The imaging system of claim 16, wherein the thin membrane window comprises glass or one or more graphene layers.

18. The imaging system of claim 11, wherein the X-ray source comprises a glass slide having a first side where the thin film anode is disposed thereon, and a second side in contact with the sample holder that is configured to hold the biological specimen.

19. The imaging system of claim 11, further comprising at least one controller configured to:

acquire a set of intensity data by the X-ray detector; and
generate an X-ray image representative of the biological specimen based on the acquired set of intensity data.

* * * * *